(12) United States Patent
Alloncle et al.

(10) Patent No.: US 10,362,683 B2
(45) Date of Patent: Jul. 23, 2019

(54) PRINTING METHOD USING TWO LASERS

(71) Applicants: CENTRE NATIONAL DE LA RECHERCHE SCIENTIFIQUE, Paris (FR); UNIVERSITE D'AIX MARSEILLE, Marseilles (FR)

(72) Inventors: Anne Patricia Blanche Alloncle, Saint Cyr sur Mer (FR); Philippe Christian Maurice Delaporte, Marseilles (FR)

(73) Assignees: CENTRE NATIONAL DE LA RECHERCHE SCIENTIFIQUE, Paris (FR); UNIVERSITE D'AIX MARSEILLE, Marseilles (FR)

(*) Notice: Subject to any disclaimer, the term of this patent is extended or adjusted under 35 U.S.C. 154(b) by 0 days.

(21) Appl. No.: 15/568,137

(22) PCT Filed: Apr. 27, 2016

(86) PCT No.: PCT/IB2016/052370
§ 371 (c)(1),
(2) Date: Oct. 20, 2017

(87) PCT Pub. No.: WO2016/174581
PCT Pub. Date: Nov. 3, 2016

(65) Prior Publication Data
US 2018/0110127 A1    Apr. 19, 2018

(30) Foreign Application Priority Data
Apr. 27, 2015 (FR) ...................... 15 53763

(51) Int. Cl.
C23C 14/30 (2006.01)
H05B 7/00 (2006.01)
(Continued)

(52) U.S. Cl.
CPC ............. *H05K 3/1275* (2013.01); *H05K 3/10* (2013.01); *H05K 3/025* (2013.01); *H05K 3/046* (2013.01);
(Continued)

(58) Field of Classification Search
CPC ....... C23C 14/048; C23C 14/14; C23C 14/04; C23C 26/02; C23C 6/00; C23C 4/06;
(Continued)

(56) References Cited

U.S. PATENT DOCUMENTS 6,815,015 B2    11/2004    Young et al.
7,001,467 B2    2/2006     Piqué

FOREIGN PATENT DOCUMENTS

EP    0862791           9/1998
WO    2006124320        11/2006
WO    WO-2015056253 A1 *  4/2015 ........... H05K 3/1241

OTHER PUBLICATIONS

James A. Grant-Jacob et al., "Micron-scale copper wires printed using femtosecond laser-induced forward transfer with automated donor replenishment", Optical Materials Express, vol. 3, No. 6, Jun. 2013.

* cited by examiner

*Primary Examiner* — Michael P Wieczorek
(74) *Attorney, Agent, or Firm* — Lex IP Meister, PLLC

(57) ABSTRACT

The invention relates to a laser printing method that includes the following steps:
(a) the provision of a receiver substrate (4);
(b) the provision of a target substrate (5) comprising a transparent substrate (50) one surface of which has a coating has a coating (51) constituted of a solid metal film;
(c) the localized irradiation of the said film (51) through the said transparent substrate (50) by means of a first laser (6)
(Continued)

in order to reach the melting temperature of the metal in a target zone of the said film which is in liquid form;

(d) the irradiation of the said liquid film through the said transparent substrate by means of a second laser on the said target zone defined in the step (c), in order to form a liquid jet in the said target zone and bring about the ejection thereof from the substrate in the form of molten metal;

(e) the depositing on the receiver substrate of a molten metal drop over a defined receiving zone, with the said drop solidifying upon cooling.

8 Claims, 1 Drawing Sheet

(51) Int. Cl.
  *H05K 3/12*  (2006.01)
  *H05K 3/10*  (2006.01)
  *H05K 3/02*  (2006.01)
  *H05K 3/04*  (2006.01)

(52) U.S. Cl.
  CPC ............... *H05K 2201/0104* (2013.01); *H05K 2201/0257* (2013.01); *H05K 2203/0528* (2013.01); *H05K 2203/0736* (2013.01); *H05K 2203/108* (2013.01); *H05K 2203/128* (2013.01)

(58) Field of Classification Search
  CPC ........ C23C 4/123; H05K 3/1275; H05K 3/10; H05K 3/025; H05K 3/046; H05K 3/20; H05K 3/18
  See application file for complete search history.

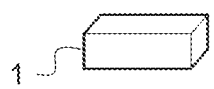
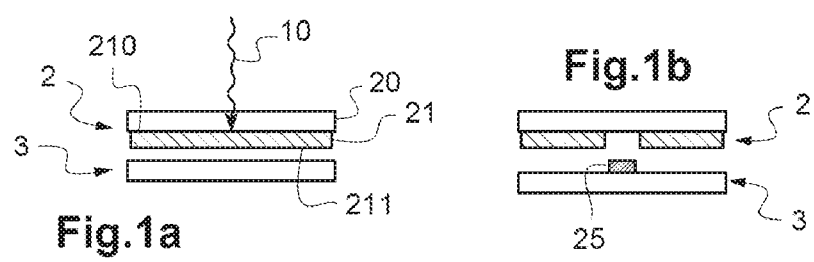
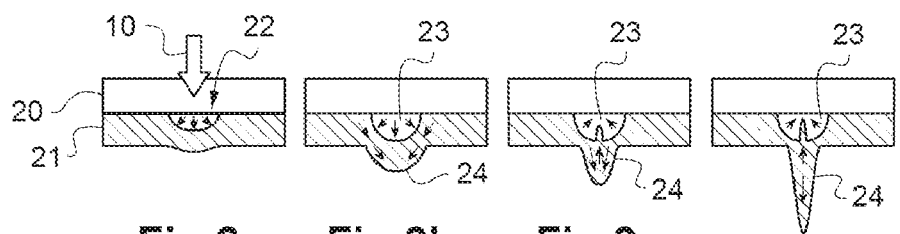
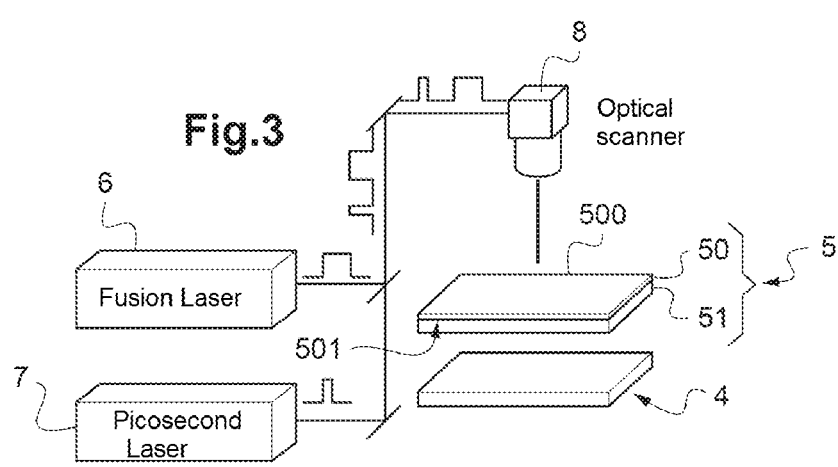

PRINTING METHOD USING TWO LASERS

The invention relates to the field of printing techniques for electronics and more particularly to a laser printing method.

The development of electronic circuits on flexible substrates is an important step for the development of connected devices and objects and applications thereof, particularly in the areas of health care, logistics and distribution. The manufacture of these objects requires a number of different technological steps and in particular the printing of conductive microscale or micrometric structures in order to respond to the problems related to interconnection.

There are two families of printing techniques for electronics that may be defined:

- The very high speed technologies that have been derived from conventional printing technologies such as flexography or offset, which require the preparation of an engraved roller or a mask and can print only one single design but at very high speed.
- The digital technologies that are much slower but that provide the ability to ensure direct control of the design to be printed by computer. The most widespread modality to date is inkjet technology, but mention can also be made of aerosol jet printing and laser printing.

Ink jet technology is widely used in research centres. It enables the printing of structures measuring a few tens of micrometers in width and less than one micrometer in thickness.

Its main limitations are related to the mechanical movement of the print heads, which at high-speed, limit the precision and resolution of the printing.

This method is only able to transfer low viscosity inks and this limits its ability to print thick conductive structures for high current applications.

Finally, the risk of clogging of the print heads is significant, the cost of inks is high and the method requires an annealing step.

In fact, the printing of metallic conductive lines by means of ink jet occurs through the transfer of silver or copper nanoparticle-based inks, followed by annealing steps to evaporate the solvent and cause the metal particles to fuse together.

Thus inkjet technology is highly relevant for certain types of deposits, however its drawbacks severely limit its scope, in particular in the field of electrical connection.

Another method has also been developed that makes possible laser printing of silver or copper nanoparticle-based ink drops. This is the process known as LIFT for Laser-Induced Forward Transfer.

FIG. 1 schematically represents the principle underlying this process. A laser pulse irradiates an layer of nanoparticle ink through a transparent substrate. This induces the formation of a cavitation bubble and a liquid jet. The said jet extends until it forms a drop on the receiver substrate located to be facing the film.

This LIFT process has made it possible to print drops having a diameter measuring as little as about twenty micrometers and with thickness of a few hundred nanometers. The use of conductive pastes or inks with higher viscosity is also possible and has provided the ability to print structures with a thickness of several microns. The juxtaposition of these drops make it possible to print 2D, and even 3D structures when a higher viscosity ink is used, on various different types of substrates, in particular polymers and flexible materials. The use of a laser with high repetition rate and an appropriate optical system has provided the means to print conductive lines having a width of 20 microns (μm) at a speed of 4 m/s.

The document U.S. Pat. No. 6,815,015 discloses a process of this type operationally implemented with a substrate having one surface covered with a rheological fluid such as an ink.

The main advantages of this laser printing process as compared to the inkjet technique are as follows:

- A higher degree of precision because there is no mechanical movement of the print head;
- The ability to print inks over a wide viscosity range (1 mPa·s [millipascal seconds] to $10^5$ mPa·s) and therefore thicker lines for conduction of considerably higher intensity currents;
- The elimination of problems related to clogging of print heads inherent in the inkjet process;
- The production of finer lines (whose thickness is less than 15 μm).

This method does not however resolve all the problems.

In particular, the only way to produce conductive lines with a high resolution and without defects, such as debris or satellites, is to transfer the metal nanoparticle ink which is onerous and costly and requires annealing steps.

These steps are also a limiting factor because they prevent the use of low cost substrates which are not able to withstand temperatures that are typically above 120° C.

In addition, this laser printing process generates an additional constraint which is the preparation of the donor substrate. This involves the preparation of a uniform ink film, with a thickness measuring between a few micrometers and a few tens of micrometers, whose properties would vary with time because of the evaporation of the solvent and which must therefore be continuously renewed.

This method can also be operationally implemented with a transparent substrate one surface of which is provided with a metal layer.

The document that may in particular be cited is EP 0 862 791 which discloses a substrate provided with a metal layer partitioned into a network of intermediate portions. The laser beam directed through the substrate causes the rapid melting of the intermediate portions and the release of the substrate in the form of a molten droplet.

Reference may also be made to the document "Micronscale copper wires printing femtosecond laser-induced forward transfer with automated donor replenishment", Grant-Jacob et al, Optical Materials Express, June 2013, Vol. 3, No. 6". This document points out that a single laser pulse is sufficient to locally melt the metal film so as to enable the generation of one drop of metal. The latter is deposited on a receiver substrate. On cooling, this drop will solidify and recover the conduction properties of the solid metal without the annealing steps being necessary.

This is an advantage compared to a similar process effectively implemented with a liquid film.

However, as it is indicated by the article mentioned above, there are some disadvantages associated with this process, in particular the energy required to eject a drop of metal is of a magnitude large enough to also eject many satellites to be rid of which is practically impossible. This approach thus induces high particulate contamination that is incompatible with the majority of applications in the microelectronics domain.

The object of the invention is thus to offer a laser printing method that overcomes the disadvantages of known processes and methods by being easy to implement operationally, and being reproducible, while making it possible to obtain a high resolution and avoid the annealing steps Thus, the invention relates to a laser printing method that includes the following steps:

(a) the provision of a receiver substrate;
(b) the provision of a target substrate comprising a transparent substrate one surface of which has a coating constituted of a solid metal film;
(c) the localised irradiation of the said film through the said transparent substrate by means of a first laser in order to reach the melting temperature of the metal in a target zone of the said film which is in liquid form;
(d) the irradiation of the said liquid film through the said transparent substrate by means of a second laser on the said target zone defined in the step (c), in order to form a liquid jet in the said target zone and bring about the ejection thereof from the substrate in the form of molten metal;
(e) the depositing on the receiver substrate of a molten metal drop over a defined receiving zone, with the said drop solidifying upon cooling.

In an advantageous manner, the first laser is a continuous wave laser or long pulse laser and the second laser is a short pulse laser.

The steps (c) and (e) may be repeated for successive target zones and receiving zones.

The steps (c) through (e) may be repeated for the same target zone and the same receiving zone.

The transparent substrate of the target substrate may be made of glass or quartz.

The metal film comprises a metal that may be selected from the group consisting of copper (Cu), gold (Au), silver (Ag) or alloys thereof.

The thickness of the metal film is in particular comprised between 50 nanometers and 10 micrometers.

The invention will be better understood and the other objects, advantages and characteristic features thereof will become more clearly apparent upon reviewing the description which follows and which has been provided with reference being made to the accompanying drawings in which:

FIG. 1 schematically represents the principle underlying the LIFT method applied to a target substrate comprising a liquid film;

FIG. 2 diagrammatically illustrates the phenomena that occur in the interior of the liquid film under the effect of the laser, during the operational implementation of the LIFT method; and FIG. 3 schematically illustrates a device that is used for effectively implementing the method according to the invention.

With reference to FIG. 1, a description will now be provided of the principle underlying the LIFT method known in the state of the art.

Thus, FIG. 1a illustrates a laser energy source 1 that is capable of generating a laser energy 10.

It also illustrates a target substrate 2 including a transparent substrate 20 and a coating 21 constituted by a liquid film.

FIG. 1a also illustrates a receiver substrate 3.

The target substrate 2 is located between the laser energy source 1 and the receiver substrate 3.

Furthermore, the coating 21 is formed on the surface of the substrate 20 which is positioned to face the receiver substrate 3. Thus, the coating 21 includes a surface 210 that is in contact with the substrate 20 and a surface 211 that is directly facing the receiver substrate 3.

This coating 21 may be constituted by a silver or copper nanoparticle based ink.

Once the target substrate 2 and the receiver substrate 3 are positioned as illustrated in FIG. 1a, the coating 21 is irradiated by means of the laser energy source 1.

In this phase of irradiation, the laser energy 10 passes through the transparent substrate 20 with the laser, so as to reach a defined target zone of the coating 21.

The laser energy 10 is sufficient to locally heat a small volume of the fluid present in the coating 21.

Reference is now made to FIG. 2a which illustrates how a drop of fluid is then formed.

FIG. 2a shows the laser energy 10 that passes through the transparent substrate 20 and the creation of steam 22 in a defined target region of the film 21.

This quantity of evaporated fluid generates an excessive pressure in the target zone which leads to pushing out of the substrate 20, the non-evaporated fluid that is present in this same target zone.

The FIGS. 2b to 2d schematically illustrate the steps of forming of a cavitation bubble 23 and a liquid jet 24.

This liquid jet extends increasingly, until the point of forming a drop 25 on a defined receiving zone of the receiver substrate 3 (FIG. 1b).

A step of annealing is then carried out.

Reference is now made to FIG. 3 which schematically illustrates a device that is used for operationally implementing the method according to the invention.

The method first of all calls for providing a receiver substrate 4 and a target substrate 5, with this target substrate comprising a transparent substrate 50, one surface 501 of which has a coating 51, here constituted of a solid metal film.

As illustrated in FIG. 3, the receiver substrate and the target substrate are positioned in a manner such that the coating 51 is directly facing the receiver substrate 4.

The device for its part comprises a first laser 6 and a second laser 7, in respect of which the movement of the beams is controlled by an optical system such as an optical scanner 8.

As illustrated in FIG. 3, the scanner 8 is positioned in a manner so as to be able to transmit the laser energy, originating from the first laser 6 or the second laser 7, on to the surface 500 of the substrate 50 opposite the film 51.

The method according to the invention first of all consists of locally irradiating the film 51 through the transparent substrate 50 by means of the first laser 6, on a defined target zone.

This first laser is of the continuous wave- or long pulsed type. This is in particular a continuous infrared diode laser whose beam can be modulated based on time.

In the irradiated target zone, the film reaches the melting temperature of the metal and is thus found in liquid form on the transparent substrate 50.

When the irradiated zone is in liquid form, the device is controlled in a manner such that the second laser 7 irradiates this same target zone through the transparent substrate 50.

This second laser 7 is of the short pulse type. By way of example, this second laser is an infrared picosecond laser, a femtosecond laser, or a nanosecond laser.

It induces the formation of a liquid jet and the depositing of a molten metal drop on the receiver substrate 4, as has previously been described in relation to FIGS. 1 and 2.

These steps will not be described in detail since the molten metal film then behaves like a liquid film. This step of the method is thus carried out as with the LIFT method described with reference to FIGS. 1 and 2.

Once deposited on the receiver substrate 4, the droplet of molten metal cools and thus solidifies. It then regains the conduction properties of the solid metal without the annealing steps becoming necessary.

Thus, the method according to the invention provides the ability to combine the advantages of the transfer in the liquid phase and in the solid phase, by using two different lasers.

This method thus makes it possible to produce connection lines from inexpensive materials and by eliminating the annealing step that limits the use of low cost receiver substrates.

It therefore makes it possible to significantly reduce manufacturing costs by allowing for the use of less expensive substrates and eliminating the annealing step. It also provides the ability to obtain a resolution that is comparable to that obtained with liquid films, this resolution therefore being better than that obtained with the ink-jet printing method. In addition, it makes it possible to avoid the generation of debris as is the case with solid phase printing with a single laser pulse.

This method may be applied to the production of flexible circuits with displays but it may also be used in the domain of photovoltaics in order to produce collecting electrodes.

In this type of application, it should be noted that at the present time there does not exist any solution for printing connection lines measuring several micrometers in thickness, which are necessary for strong currents, with a method that is contactless and adaptable to the product, so as to respect the fragility of thin films.

This method also opens up the possibility of printing any type of material and achieving nanoscale dimensions. In effect, the size of the printed pixels is controlled by the fluence of the laser but mostly also by the thickness of the liquid film. The printing method according to the invention which effectively implements a dual pulse laser will provide for the production of liquid films of nanoscale thickness and therefore enable the printing of pixels measuring a few tens of nanometers in diameter. This clears the way towards achieving plasmonic structures and photonic crystals.

The reference signs inserted after the technical characteristic features mentioned in the claims are intended for the sole purpose of facilitating the understanding of the latter and shall by no means limit the scope thereof.

The invention claimed is:

1. A laser printing method that includes the following steps:
   (a) providing a receiver substrate;
   (b) providing a target substrate comprising a transparent substrate one surface of which has a solid coating comprising metal;
   (c) localised irradiation of the coating through the transparent substrate by means of a first laser in order to reach the melting temperature of the metal in a target zone of the coating and thereby form a liquid film;
   (d) irradiation of the liquid film through the transparent substrate by means of a second laser on the target zone defined in the step (c), in order to form a liquid jet in the target zone and bring about the ejection thereof from the target substrate in the form of molten metal;
   (e) depositing on the receiver substrate a molten metal drop over a defined receiving zone, with the drop solidifying upon cooling.

2. The method according to claim 1 in which the first laser is a continuous infrared diode laser whose beam can be modulated based on time.

3. The method according to claim 1 in which the second laser is an infrared picosecond laser, a femtosecond laser, or a nanosecond laser.

4. The method according to claim 1, in which the steps (c) to (e) are repeated for successive target zones and receiving zones.

5. The method according to claim 1, in which steps (c) to (e) are repeated for the same target zone and receiving zone.

6. The method according to claim 1 in which the transparent substrate of the target substrate is made of glass or quartz.

7. The method according to claim 1 in which the metal is selected from the group consisting of copper (Cu), gold (Au), silver (Ag) or alloys thereof.

8. The method according to claim 1 in which the thickness of the solid coating is between 50 nanometers and 10 micrometers.

* * * * *